(12) United States Patent
Ruckerbauer et al.

(10) Patent No.: US 7,397,684 B2
(45) Date of Patent: Jul. 8, 2008

(54) SEMICONDUCTOR MEMORY ARRAY WITH SERIAL CONTROL/ADDRESS BUS

(75) Inventors: Hermann Ruckerbauer, Moos (DE); Ralf Schledz, Zolling (DE); Johannes Stecker, Munich (DE); Dominique Savignac, Ismaining (DE); Georg Braun, Holzkirchen (DE)

(73) Assignee: Infineon Technologies, AG, Neubiberg (DE)

( * ) Notice: Subject to any disclaimer, the term of this patent is extended or adjusted under 35 U.S.C. 154(b) by 21 days.

(21) Appl. No.: 11/226,447

(22) Filed: Sep. 15, 2005

(65) Prior Publication Data

US 2007/0058408 A1 Mar. 15, 2007

(51) Int. Cl.
*G11C 5/06* (2006.01)
(52) U.S. Cl. .................. 365/63; 365/51; 365/221
(58) Field of Classification Search ............ 365/63, 365/51, 221, 52, 230.03, 233, 191, 189.12; 711/105
See application file for complete search history.

(56) References Cited

U.S. PATENT DOCUMENTS

| | | | |
|---|---|---|---|
| 6,493,250 B2 * | 12/2002 | Halbert et al. ............. | 365/63 |
| 7,061,784 B2 * | 6/2006 | Jakobs et al. ............. | 365/51 |
| 7,184,360 B2 | 2/2007 | Gregorius et al. | |
| 7,224,636 B2 * | 5/2007 | Jakobs et al. ............. | 365/233 |
| 2004/0160832 A1 * | 8/2004 | Janzen et al. ............. | 365/191 |
| 2005/0036349 A1 * | 2/2005 | Jakobs et al. ............. | 365/51 |
| 2006/0004953 A1 * | 1/2006 | Vogt ...................... | 711/105 |
| 2006/0291263 A1 * | 12/2006 | Wallner et al. ............. | 365/63 |
| 2007/0064462 A1 * | 3/2007 | Matusui .................. | 365/63 |

* cited by examiner

*Primary Examiner*—Richard T. Elms
*Assistant Examiner*—Dang Nguyen
(74) *Attorney, Agent, or Firm*—Edell, Shapiro & Finnan, LLC

(57) ABSTRACT

A semiconductor memory array for operation in a data storage system with at least one semiconductor memory chip for the storage of user data and one memory controller for control of the at least one semiconductor memory chip includes at least one unidirectional, serial signal line bus for control and address signals connected with the memory controller, directly connecting at least one semiconductor memory chip with the memory controller and serially connecting with each other the semiconductor memory chips among each other by 1-point-to-1-point connections.

17 Claims, 2 Drawing Sheets

SEMICONDUCTOR MEMORY ARRAY WITH SERIAL CONTROL/ADDRESS BUS

FIELD OF THE INVENTION

The present invention relates to semiconductor memories and, more particularly, to a semiconductor memory array for a data storage system with at least one semiconductor memory chip for user data with control/address signals of a memory controller being transmitted by a control and address bus to the semiconductor memory chip/chips.

BACKGROUND

Against a background of steadily increasing processor operating speed in computers, such as personal computers, workstations, and servers, it is essential that the operating speed of semiconductor memories is increased to prevent performance losses. Thus, in the last few years, memory modules have been developed with high-speed and high-density memory blocks, such as DDR-DRAMs (Double Data Rate Dynamic Random Access Memory) of the generation stages 1, 2 and 3 in which it was possible to improve the operating speed and structural density.

In a conventional DIMM semiconductor memory module with DDR-DRAMs as semiconductor memory chips, two or four ranks per semiconductor memory module are provided, for example, where one rank each may be arranged on the front or, respectively, the rear side of the semiconductor memory module, or two (2) ranks each may be arranged in stacks on one same side of the semiconductor module, respectively. According to common definition, "rank" is understood as the number of semiconductor memory chips (DRAMs) necessary to occupy the complete bit width of a signal bus connecting the semiconductor memory units with a memory controller. Accordingly, with a bus width of 64 bit or, respectively, 72 bits including an error correction block ECC (Error Correction Code), 16 (or, respectively, 18 with ECC) semiconductor memory chips are required per rank with 4 bit data width or 8 (respectively, 9 with ECC) semiconductor storage chips with 8 bit data width. For example, 4 ranks with 8 bit wide memory units each are realized in registered DIMMs in which the control and address bus is buffered. More precisely, on an x8 based DIMM with 4 ranks on the front and rear side of the wiring board, two ranks each of 8 memory blocks each are wired to each other at several wiring levels by vias and signal wiring runs passing through the wiring board.

In a conventional memory chip topology, for example, in DDR3 DRAMs, the individual memory chips are connected by a flyby topology with the memory controller. The control and address signal pins of the individual memory chips are each connected in series to a flyby bus.

A major disadvantage of the flyby topology is the too narrow bandwidth for high data rates of 1.6 Gbit/s/pin, for example, and a too low structural density. An improved semiconductor memory array by which a wide bandwidth and a high structural density can be realized even at high data rates of at least 1.6 Gbit/s/pin is desirable.

SUMMARY

A semiconductor memory array for operation in a data storage system includes at least one semiconductor memory chip for the storage of user data, a memory controller for control of the semiconductor memory chips, and at least one unidirectional serial signal line bus for control and address signals. By the at least one unidirectional, serial signal line bus for control and address signals, the memory controller is directly connected with at least one semiconductor memory chip of the semiconductor memory array, while the semiconductor memory chips among each other are serially connected by 1-point-to-1-point connections. In the semiconductor memory array according to the present invention, at least one separate unidirectional, serial signal line bus for write data is provided where the memory controller is directly connected with at least one semiconductor memory chip of the semiconductor memory array, while the semiconductor memory chips are serially connected among each other by 1-point-to-1-point connections. The signal line bus for control and address data can be combined with the signal line bus for write data. For a re-drive of write data, the semiconductor memory chips can each be provided with re-drive unit to re-drive, in a forward direction, the write data received by the memory controller.

Furthermore, the semiconductor memory array includes at least one unidirectional, serial signal line bus for read data which has the same signal line direction as the unidirectional signal line bus for control and address signals between the semiconductor memory chips, with the unidirectional signal line bus for read data serially connecting the semiconductor memory chips among each other by 1-point-to-1-point connections and directly connecting at least one semiconductor memory chip with the memory controller. Insofar, any signal line bus employed in the semiconductor memory array according to the invention has a line topology where one semiconductor memory chip each is provided with two 1-point-to-1-point connections.

In the line topology of the control and address bus in accordance with the present invention, one chain of loop-type connected semiconductor memory chips ends at the last semiconductor memory chip connected in a chain. Moreover, at least one semiconductor memory chip is provided with an evaluation unit for evaluating the control and address signals originating from the memory controller and/or a re-drive unit ("re-drive" functionality) to re-drive, in forward direction, any control and address signals received. An evaluation of the control and address signals by the evaluation unit is, for example, done such that the evaluation unit will ascertain whether the received control and address signals are relevant for the semiconductor memory chip belonging to the evaluation unit, i.e., whether they are intended for execution by this semiconductor memory chip. In case of a positive evaluation by the evaluation unit, execution of the control and address signals by the corresponding semiconductor memory chip will be performed, such as a read or write action, for example, wherein a re-drive of the received control and address signals in forward direction can also take place. For a re-drive of read data, the semiconductor memory chips are each provided with re-drive unit to re-drive the read data in forward direction. The signal line bus for control/address signals and/or the signal line bus for write data and/or the signal line bus for read data can each be combined with each other. In the same manner, the signal line busses can each be combined with a clock signal.

To achieve a particularly large bandwidth with high data rates, a differential line arrangement is for the signal line busses employed in the semiconductor memory array according to the present invention.

In the semiconductor memory array according to the invention, the semiconductor memory chips are, for example, DRAM components, which can, for example, each feature a DDR interface.

The semiconductor memory array in accordance with the invention can, as such, be designed on a system PCB. Alternatively, the semiconductor memory array can be arranged on a semiconductor memory module, for example, a DIMM semiconductor memory module, which may be suitable and intended to be plugged into a slot on the system PCB. The invention extends furthermore to a data storage system with a semiconductor memory array as described above.

BRIEF DESCRIPTION OF THE FIGURES

The invention will now be explained in detail with reference to the enclosed drawings. Identical elements or, respectively, elements having the identical effect are provided with identical reference numbers in the drawings.

DETAILED DESCRIPTION

Figure 1:
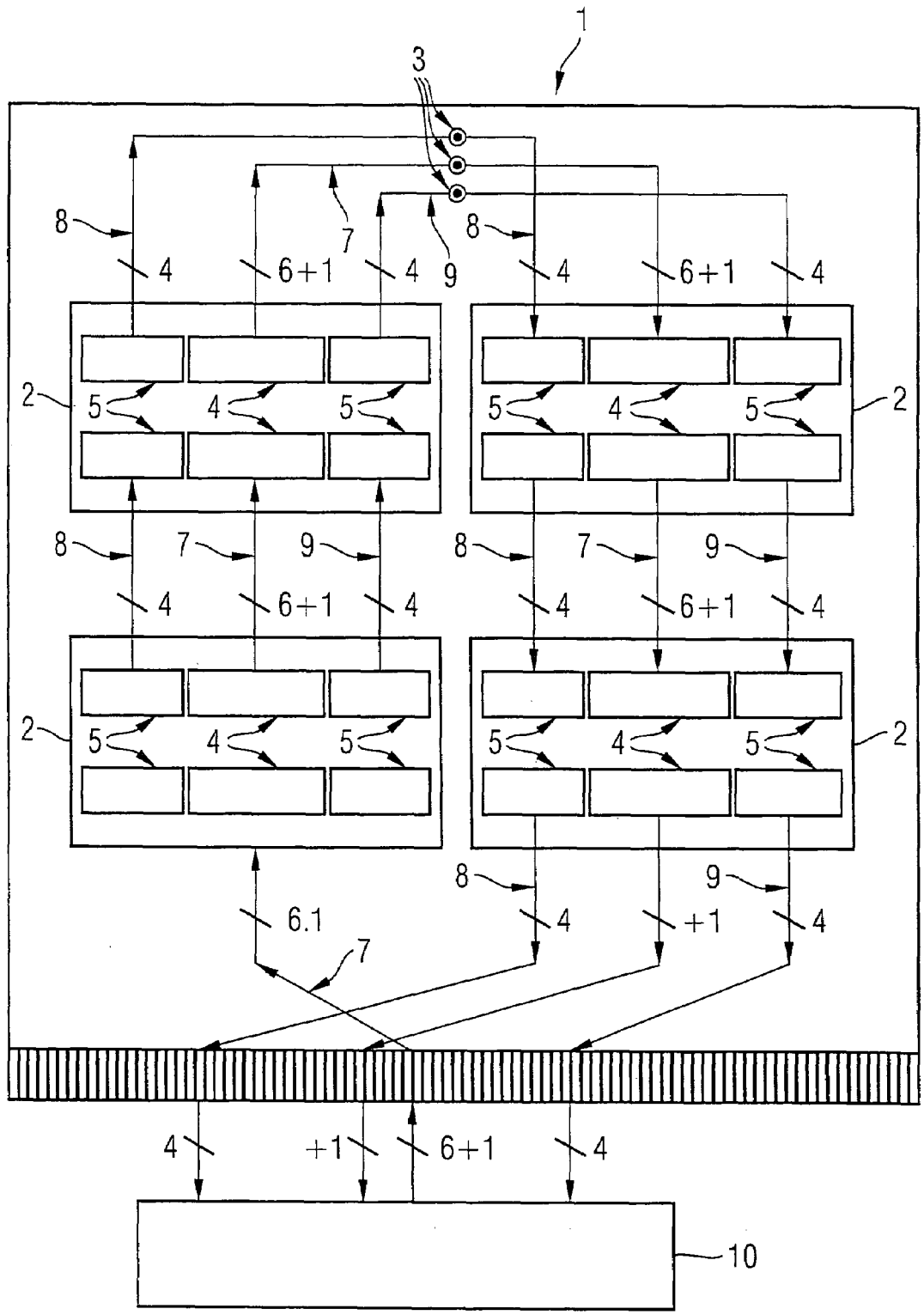
FIG. 1 shows schematically the signal line bus topology in a design of the semiconductor memory array in accordance with the invention.

Referring to FIG. 1, the signal line bus topology is schematically illustrated based on the signal "lane" in a design of the semiconductor memory array according to the invention. "Lane" designates a bus of a specific width. In the case of a DDR3 architecture, a byte lane has 8 bits; with x4 based DRAMs, a nibble lane. Generally, the term lane combines a group of signals that are identical among each other; which, however, differ as a group from other signals.

In case of a standard architecture with re-drive in which the 8 bit also flyby between the DRAMS, the term lane is used for the complete bus from memory controller to the DRAM, i.e., in this case, one lane has, for example, 6 eCA signals and the 8 rD signals. That means, if the memory blocks have a read data organization of x8 and the memory controller has a bus width of 32 bits, 4 (byte) lanes are needed to meet the rank definition. However, due to the different topology, not only the 8-bit wide read data bus belongs, in this case, to the term lane, but also the, e.g., 6-bit wide CA bus. In the case of this architecture with re-drive, one lane again refers to only one read (write data) bus since the eCA/write data are exchanged between the lanes. (Where the write data belong depends on how the busses are combined.)

FIG. 1 illustrates one single lane designated with the reference number 1, of an x8 based DIMM semiconductor memory module with a total of 4 identical lanes. Accordingly, 2 DRAM memory chips 2 are provided on one front side and 2 DRAM memory chips 2 on the rear side of the semiconductor memory module. The DRAMs on the front side of the DIMM module 1 are assigned to a first and a second rank, while the DRAMs on the rear side of the DIMM module 1 are assigned to a third and a fourth rank. The DIMM module includes a total of 16 DRAMs 2.

Each lane 1 of the DIMM module is connected with a memory controller 10 by a unidirectional signal line bus 7 for control and address signals combined with a unidirectional signal line bus for write data and two signal lines busses 8, 9 for read data. Due to an ODIC package, two 4-bit wide busses are here concerned. With a different package, it could be an x8 bus.

The combined signal line bus 7 for control and address signals and write data combines one DRAM directly with the memory controller 10, while the DRAMs on the front side and on the rear side of lane 1 of the DIMM module are connected in series with each other by 1-point-to-1-point connections with each DRAM being merely provided with two 1-point-to-1-point connections. Each of the two signal line busses for read data 8, 9 connects the DRAMS on the front side and on the rear side of a lane 1 of the DIMM module in series with each other by 1-point-to-1-point connections. A semiconductor memory chip is connected with the memory controller 10 to process the data read. The corresponding signal lines busses 7, 8, 9 are connected with each other by corresponding via contacts 3 on the front side and the rear side of the DIMM module. The signal line busses 7, 8, 9 each have one identical signal line direction.

The combined signal line bus 7 for control and address signals and write data is a data bus combined with a clock signal with a bit width of 7 bits of which 6 bits are required for data signals. As can be seen from FIG. 1, the clock signal (+1) is returned to the memory controller 10. The two signal line busses 8, 9 for read data are 4-bit wide busses each. Overall, 16 bits are available for the signal line busses for control/address signals and write data, as well as read data per lane so that per DIMM module with 4 lanes overall, a bit width of 64 bits is required with data information only being transmitted on 6+8=14 lines per lane. With DDR 1-3, the 64 bits refer to a purely read/write data bus width.

The signal line busses of the DIMM module illustrated in FIG. 1 are differential line pairs.

Furthermore, the DRAMs are provided with a combined re-drive/evaluation unit 4 for re-driving or, respectively, evaluating control and address signals, wherein the re-drive unit can also effect a re-drive of the control and address signals, if an evaluation by the evaluation unit shows that the DRAM concerned is an addressee. Furthermore, in the re-drive/evaluation unit 4 of the DRAMs, a re-drive unit for write data to the DRAMs connected with it will be integrated in each case. Furthermore, the DRAMs are each connected with a re-drive unit 5 for the re-drive of read data.

Figure 2:
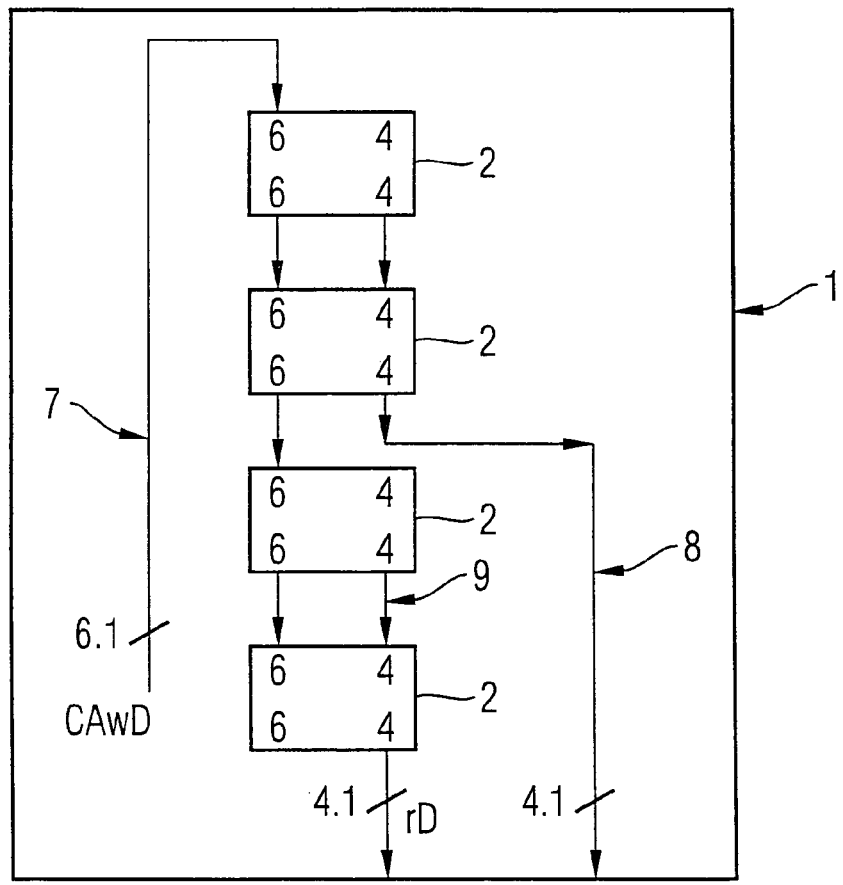
FIG. 2 shows schematically the signal line bus topology in an additional design of the semiconductor memory array in accordance with the invention.

Referring to FIG. 2, the signal line bus topology is illustrated schematically based on an individual lane in an additional embodiment of the semiconductor memory array in accordance with the invention. To avoid unnecessary repetitions, the differences to the semiconductor memory array of FIG. 1 will be explained.

One DIMM module includes a total of 4 lanes with 16 semiconductor chips 2, divided to two ranks, with only one lane 1 being presented in FIG. 2. For every lane 1, a unidirectional signal line bus 7 for control and address signals is combined with a unidirectional signal line bus for write data, and the DRAMs serially connected with each other by point-to-point connections, with one DRAM being directly connected with a memory controller not shown. Furthermore, for each lane 1, two signal line busses 8, 9 each serially connecting two DRAMs 2 are provided for write data connected with a memory controller (not shown in detail). On the DIMM, the signal line busses 7, 8, 9 each have a same signal line direction. The signal line bus for read data 7 connects a DRAM belonging to a rank 1a with a DRAM belonging to an identical rank 2a, while the signal line bus for read data 9 connects a DRAM belonging to a rank 1b with a DRAM belonging to an identical rank 2b, so that 2 DRAMs of one lane are always combined to one rank, which is a difference to the topology shown in FIG. 1.

In the topology shown in FIG. 2, 11 input connections and 11 output connections are necessary for each DRAM so that, as compared with the topology shown in FIG. 1 where 15 input and 15 output connections are required per DRAM, fewer input and output connections per DRAM are required.

The surfaces provided per DRAM are reduced, less electric power is consumed per DRAM, and the technical realization is simplified overall.

Figure 3:
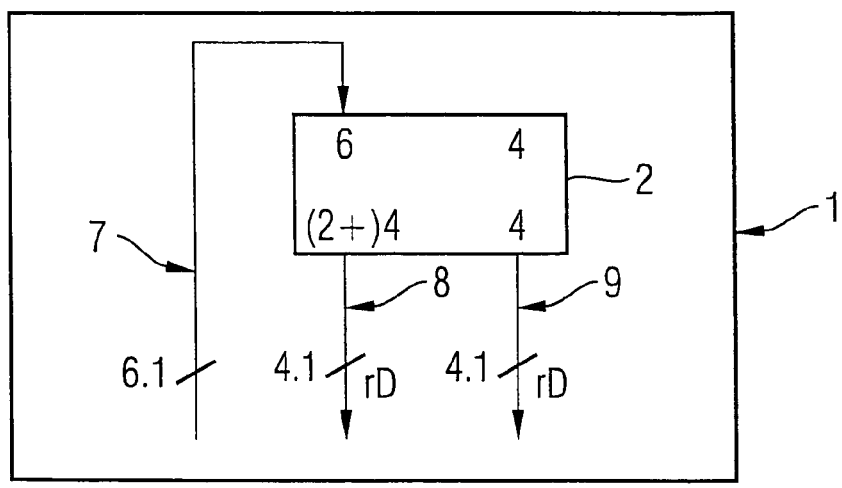
FIG. 3 shows schematically the signal line bus topology in an additional design of the semiconductor memory array in accordance with the invention.

Referring to FIG. 3, the signal line bus topology is schematically illustrated based on a lane in another embodiment of the semiconductor memory array in accordance with the invention. To avoid unnecessary repetitions, the differences to the semiconductor memory array of FIG. 1 will be explained.

In an x8 based DIMM module, four lanes with a total of 4 DRAMs and 1 rank are provided. FIG. 3 shows only one lane 1. For every lane 1 with only 1 DRAM, one unidirectional signal line bus 7 for control and address signals is combined with a unidirectional signal line bus for write data and two signal line busses 8, 9 for write data. One part (4 bits) of the signal line bus 7 for control and address signals are converted to a signal line bus for write data so that, per DRAM, 11 input and 9 output connections are necessary, so that, compared with the topology shown in FIG. 2, where 11 input and 11 output connections are necessary per DRAM, fewer input and output connections per DRAM are required. The surfaces provided per DRAM are further reduced, less electrical power is used per DRAM and overall, the technical realization is simpler. The DRAMs of the DIMM module of FIG. 3 do not require any re-drive functionality. Independent of the necessary pins, the objective is to use the same DRAM for the configurations of FIG. 2 and FIG. 3. The DRAM of FIG. 2 is made configurable to realize the configuration of FIG. 3.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

What is claimed:

1. A memory array for operation in a data storage system, comprising:
    a plurality of memory chips for the storage of user data, said plurality of memory chips being subdivided into chip groups, each chip group being associated with one signal lane;
    a memory controller for the control of the memory chips; and
    at least one unidirectional, serial signal line bus for control signals and address signals connected with the memory controller, each signal line bus for control signals and address signals being associated with a respective signal lane, the bus signal lines corresponding to the respective signal lane directly connecting exactly one memory chip of the respective chip group with the memory controller and, in the case a chip group comprises more than one memory chip, serially connecting the memory chips of the respective chip group with each other by respective 1-point-to-1-point connections.

2. The memory array according to claim 1, wherein each chip group further comprises:
    at least one unidirectional, serial signal line bus for read data with the same signal line direction as the unidirectional signal line bus for control and address signals between the memory chips of the respective chip group, wherein, in the case a chip group comprises more than one memory chip, the unidirectional signal line bus for read data serially connects the memory chips of the respective chip group among each other by respective 1-point-to-1-point connections and directly connects at least one memory chip of the respective chip group with the memory controller.

3. The memory array according to claim 1, wherein at least one memory chip of each chip group includes a control/address signal re-drive unit for the re-drive of control and address signals.

4. The memory array according to claim 1, wherein at least one memory chip of each chip group includes a control/address signal evaluation unit for evaluating control and address signals.

5. The memory array according to claim 1, wherein at least one memory chip of each chip group includes a read signal re-drive unit for the re-drive of read signals.

6. The memory array according to claim 2, wherein each chip group further comprises:
    at least one unidirectional, serial signal line bus for write data, which has the same signal line direction as the unidirectional signal line bus for control and address signals between the memory chips of the respective chip group, with the unidirectional signal line bus for write data directly connecting exactly one memory chip of the respective chip group with the memory controller and, in the case the chip group comprises more than one memory chip, serially connecting the memory chips of the same chip group among each other by respective 1-point-to-1-point connections.

7. The memory array according to claim 6, wherein at least one memory chip of each chip group includes a read signal re-drive unit for a re-drive of read signals.

8. The memory array according to claim 1, wherein for each chip group at least one signal wiring run is set up of differential signal line pairs, the at least one signal wiring run being selected from a signal wiring run for control and address signals, a signal wiring run for read data and a signal wiring run for write data.

9. The memory array according to claim 6, wherein for each chip group at least one signal line bus is combined with a clock signal bus, the at least one signal line bus being selected from the signal line bus for control and address signals, the signal line bus for read data and the signal line bus for write data.

10. The memory array according to claim 6, wherein for each chip group at least two signal line busses are combined with each other, the at least two signal line busses being selected from the signal line bus for control and address signals, the signal line bus for read data and the signal line bus for write data.

11. The memory array according to claim 1, wherein each memory chip is a DRAM block.

12. The memory array according to claim 11, wherein each memory chip has one DDR interface each.

13. The memory array according to claim 1, wherein the memory array is arranged on a DIMM memory module.

14. The memory array according to claim 13, wherein the memory module is an x8 based memory module with 4 memories per rank.

15. The memory array according to claim 13, wherein the memory module is an x8 based memory module with 1 memory per rank.

16. The memory array according to claim 15, wherein the memory module is an x4 based memory module with 8 memories per rank.

17. A data storage system with a memory array, said memory array comprising:

a plurality of memory chips for the storage of user data, said plurality of memory chips being subdivided into chip groups, each chip group being associated with one signal lane:

a memory controller for the control of the memory chips; and at least one unidirectional, serial signal line bus for control signals and address signals connected with the memory controller, each signal line bus for control signals and address signals being associated with a respective signal lane, the bus signal lines corresponding to the respective signal lane directly connecting exactly one memory chip of the respective chip group with the memory controller and, in case a chip group comprises more than one memory chip, serially connecting the memory chips of the respective chip group with each other by respective 1-point-to-1-point connections.

* * * * *